(12) United States Patent
Antonakopoulos et al.

(10) Patent No.: US 9,595,322 B2
(45) Date of Patent: *Mar. 14, 2017

(54) STORAGE DEVICE WITH 2D CONFIGURATION OF PHASE CHANGE MEMORY INTEGRATED CIRCUITS

(71) Applicant: INTERNATIONAL BUSINESS MACHINES CORPORATION, Armonk, NY (US)

(72) Inventors: Theodoros A. Antonakopoulos, Patras (GR); Evangelos Eleftheriou, Rüschlikon (CH); Ioannis Koltsidas, Zurich (CH); Peter Mueller, Zurich (CH); Aspasia Palli, Eleusis (GR); Roman A. Pletka, Uster (CH)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 14/747,665

(22) Filed: Jun. 23, 2015

(65) Prior Publication Data

US 2015/0294720 A1 Oct. 15, 2015

Related U.S. Application Data

(63) Continuation of application No. 14/643,544, filed on Mar. 10, 2015.

(30) Foreign Application Priority Data

Mar. 10, 2014 (GB) .................................. 1404173.5

(51) Int. Cl.
G11C 13/00 (2006.01)
G11C 14/00 (2006.01)
G11C 7/10 (2006.01)

(52) U.S. Cl.
CPC .......... *G11C 13/0004* (2013.01); *G11C 7/106* (2013.01); *G11C 7/1087* (2013.01);
(Continued)

(58) Field of Classification Search
CPC ......................... G11C 13/003; G11C 13/0004
(Continued)

(56) References Cited

U.S. PATENT DOCUMENTS 7,889,544 B2 2/2011 Chow et al.
8,051,253 B2 11/2011 Okin et al.
(Continued)

FOREIGN PATENT DOCUMENTS

EP 2204816 A2 7/2010
WO 2014107335 A1 7/2014

OTHER PUBLICATIONS

Son, Y.H. et al., "Reducing Memory Access Latency with Asymmetric DRAM Bank Organizations," ACM SIGARCH Computer Architecture News—ICSA '13, vol. 41, Issue 3, Jun. 2013. (pp. 380-391).
Qureshi, M.K. et al., "PreSET: Improving Performance of Phase Change Memories by Exploiting Asymmetry in Write Times," Computer Architecture (ISCA), 2012 39th Annual International Symposium Jun. 2012. (pp. 380-391).
List of IBM Patents or Patent Applications Treated as Related.

*Primary Examiner* — Hoai V Ho
*Assistant Examiner* — Jay Radke
(74) *Attorney, Agent, or Firm* — Tutunjian & Bitetto, P.C.; Keivan Razavi

(57) ABSTRACT

A storage device, apparatus, and method to write and/or read data from such storage device. The storage device, comprises a channel controller and phase change memory integrated circuits (PCM ICs) arranged in sub-channels, wherein each of the sub-channels comprises several PCM ICs con-
(Continued)

nected by at least one data bus line, which at least one data bus line connects to the channel controller. The channel controller is configured to write data to and/or read data from the PCM ICs according to a matrix configuration of PCM ICs, wherein: a number of columns of the matrix configuration respectively corresponds to a number of the sub-channels, the sub-channels forming a channel, and a number of rows of the matrix configuration respectively corresponds to a number of sub-banks, the sub-banks forming a bank, wherein each of the sub-banks comprises PCM ICs that belong, each, to distinct sub-channels of the sub-channels.

12 Claims, 4 Drawing Sheets

(52) U.S. Cl.
CPC .......... *G11C 13/003* (2013.01); *G11C 13/004* (2013.01); *G11C 13/0023* (2013.01); *G11C 13/0061* (2013.01); *G11C 13/0069* (2013.01); *G11C 14/0045* (2013.01); *G11C 7/10* (2013.01); *G11C 2013/0088* (2013.01)

(58) Field of Classification Search
USPC ...................................... 365/148, 163, 230, 3
See application file for complete search history.

(56) References Cited

U.S. PATENT DOCUMENTS

| | | |
|---|---|---|
| 8,379,450 B2 | 2/2013 | Kim |
| 8,463,979 B2 | 6/2013 | Schuette |
| 8,495,471 B2 | 7/2013 | Antonakopoulos et al. |
| 9,384,834 B2* | 7/2016 | Antonakopoulos G11C 13/0069 |
| 2007/0255891 A1 | 11/2007 | Chow et al. |
| 2008/0147968 A1 | 6/2008 | Lee et al. |
| 2008/0215802 A1 | 9/2008 | Chow et al. |
| 2008/0285334 A1 | 11/2008 | Chow et al. |
| 2011/0283081 A1 | 11/2011 | Barkley et al. |
| 2012/0304039 A1 | 11/2012 | Peterson et al. |
| 2014/0006696 A1 | 1/2014 | Ramanujan et al. |
| 2015/0243356 A1* | 8/2015 | Conte ................ G11C 13/0069 365/163 |

\* cited by examiner

STORAGE DEVICE WITH 2D CONFIGURATION OF PHASE CHANGE MEMORY INTEGRATED CIRCUITS

RELATED APPLICATION DATA

This application is a Continuation application of co-pending U.S. patent application Ser. No. 14/643,544 filed on Mar. 10, 2015, which claims priority under 35 U.S.C. §119 from United Kingdom Patent Application No. 1404173.5 filed Mar. 10, 2014, both of which are incorporated herein by reference in their entirety.

BACKGROUND

Technical Field

The invention generally relates to solid-state drive storage devices, and in particular to devices comprising phase change memory integrated circuits and methods of writing to and/or reading data from such devices.

Description of the Related Art

Phase Change Memory ("PCM") is a frontrunner technology for the next generation of Solid-State Drive ("SSD") based storage and extended memory subsystems. A main drawback of PCM memories is the asymmetric read/write latencies: the write time for storing a block of information is much longer, compared to the time required for accessing the same amount of data during a read operation. When high-speed interfaces are used, as in DRAM, this time difference is greater than an order of magnitude. As a result of this performance difference, future Solid-state-Drives ("SSDs") that would be based on PCM could yield very low write performance (compared to the read performance) and high variability on mixed workloads. The most common approach to this problem is to use a DRAM-based cache in the SSD in order to coalesce write commands, and reduce effective latency. However, this approach is not optimal, as the cache is limited in size: its effect depends on the ratio of the DRAM size to the total PCM memory space.

In general, SSDs involve multiple channels that operate in parallel. Each channel consists of a number of independently accessed Integrated Circuits ("ICs"), which share the same data bus. A data block is defined as an entity that can be written at once; thus, its size depends on the number of concurrent write operations implemented in the PCM IC. Due to the limited size, in terms of bytes, of a data block supported by a PCM IC, programming of a single page (a page consists of a number of such data blocks) requires multiple program cycles, which results in a higher write time.

One solution to this problem is to increase the number of concurrent write operations per PCM IC, in order to increase the data block size and thus to decrease the number of program cycles. There are some limitations on the maximum number of write concurrent write operations that can be integrated in a chip due to the layout technology used and the benefits of this type of solution diminish as the page size increases, a common trend in today's storage systems. Another approach is to split the page to multiple channels and store the segments to independent channels, but such an approach does not address the problem of the performance difference between read and write.

SUMMARY

According to a first aspect, the present invention is embodied as a storage device, comprising:

a channel controller; and phase change memory integrated circuits, or PCM ICs, arranged in sub-channels, wherein each of the sub-channels comprises several PCM ICs connected by at least one data bus line, which at least one data bus line connects to the channel controller, wherein the channel controller is configured to write data to and/or read data from the PCM ICs according to a matrix configuration of PCM ICs, wherein:

a number of columns of this matrix configuration respectively corresponds to a number $N_s$ of the sub-channels, $N_s \geq 2$, the sub-channels forming a channel; and a number of rows of this matrix configuration respectively corresponds to a number $N_I$ of sub-banks, $N_I \geq 2$, the sub-banks forming a bank, wherein each of the sub-banks comprises PCM ICs that belong, each, to distinct sub-channels of the sub-channels.

In embodiments, each of the sub-channels comprises several PCM ICs that are connected to the channel controller by respective control bus lines, and the channel controller is configured to write data to and/or read data from the PCM ICs, using control signals conveyed in the control bus lines, respectively to select and/or identify the sub-banks to which data is to be written and/or the sub-banks from which data is to be read.

Preferably, the channel controller is configured at least to write data to the PCM ICS according to said matrix configuration, and the channel controller is further configured to: break data to be written to the PCM ICs into data chunks; and buffer data chunks into buffered data chunks according to the data bus lines, consistently with sub-banks to which said data is to be written, prior to instructing to write the buffered data chunks to sub-banks according to control signals conveyed in the control bus lines.

In preferred embodiments, the channel controller is configured at least to read data from the PCM ICS according to said matrix configuration, and the channel controller is further configured to: instruct to read data chunks sub-bank by sub-bank, using control signals conveyed in the control bus lines, whereby data chunks in one sub-bank are instructed to be read before instructing to read data chunks of another sub-bank; and re-assemble data chunks read.

Preferably, at least two PCM ICs of one or more of the $N_I$ of sub-banks, preferably each of the $N_I$ of sub-banks, share same control signals.

In embodiments, said matrix configuration further includes at least two sub-banks on one or more given rows of said matrix configuration, wherein said at least two sub-banks comprise two distinct sets of PCM ICs, whereby said at least two sub-banks do not share same control signals.

Preferably, the channel controller is further configured to exclude a subset of one or more of the sub-banks when writing data across the sub-banks, said subset of one or more of the sub-banks being preferably predetermined.

In preferred embodiments, the channel controller is further configured to instruct, while first data are being written to or read from a first sub-bank of the sub-banks, to write second data to or read second data from a second sub-bank of the sub-banks.

According to another aspect, the invention can be embodied as a storage apparatus comprising at least two storage devices according to any of the above embodiments, which further comprises a data storage controller connected to each channel controller of said at least two storage devices.

According to still another aspect, the invention can be embodied as a method for optimizing a storage device according to embodiments of the invention, the method comprising: optimizing the number $N_s$ of sub-channels and/or the number $N_l$ of sub-banks in the matrix arrangement, based on characteristics of the PCM ICs. Preferably, optimizing is carried out based on characteristics of a bus that comprises said data bus lines.

According to yet another aspect, the invention is embodied as a method of writing data to a storage device according to embodiments of the invention, comprising, at the channel controller: breaking data to be written to the PCM ICs into data chunks; and distributing the data chunks sub-bank by sub-bank for subsequent writing, such that first data chunks are instructed to be written to a first sub-bank before instructing to write second data chunks to a second sub-bank.

Preferably, this method further comprises: buffering data chunks according to the data bus lines, consistently with the sub-banks to which the data chunks are to be written, to distribute the data chunks sub-bank by sub-bank.

According to yet another aspect, the invention is embodied as a method of reading data from a storage device according to embodiments of the invention, comprising, at the channel controller: instructing to read data chunks sub-bank by sub-bank, whereby data chunks in a first sub-bank are instructed to be read before instructing to read data chunks of second sub-bank; re-assembling data chunks into a data sector; and providing the re-assembled data sector to a host.

Preferably, present methods of writing and/or reading data further comprises, at the channel controller: using control signals conveyed in the control bus lines to select or identify the sub-banks to which data is to be written or the sub-banks from which data is to be read, respectively, and wherein, preferably, a set of PCM ICs of a same sub-bank share the same addressing space, which implicitly determines where data chunks are to be written or to be read in the ICs of this set.

Devices, apparatuses and methods embodying the present invention will now be described, by way of non-limiting examples, and in reference to the accompanying drawings. Technical features depicted in the drawings are not necessarily to scale.

DETAILED DESCRIPTION OF THE INVENTION

The following description is structured as follows. First, general embodiments and high-level variants are described (sect. 1). The next section addresses more specific embodiments and technical implementation details (sect. 2).

1. General Embodiments and High-Level Variants

Figure 1:
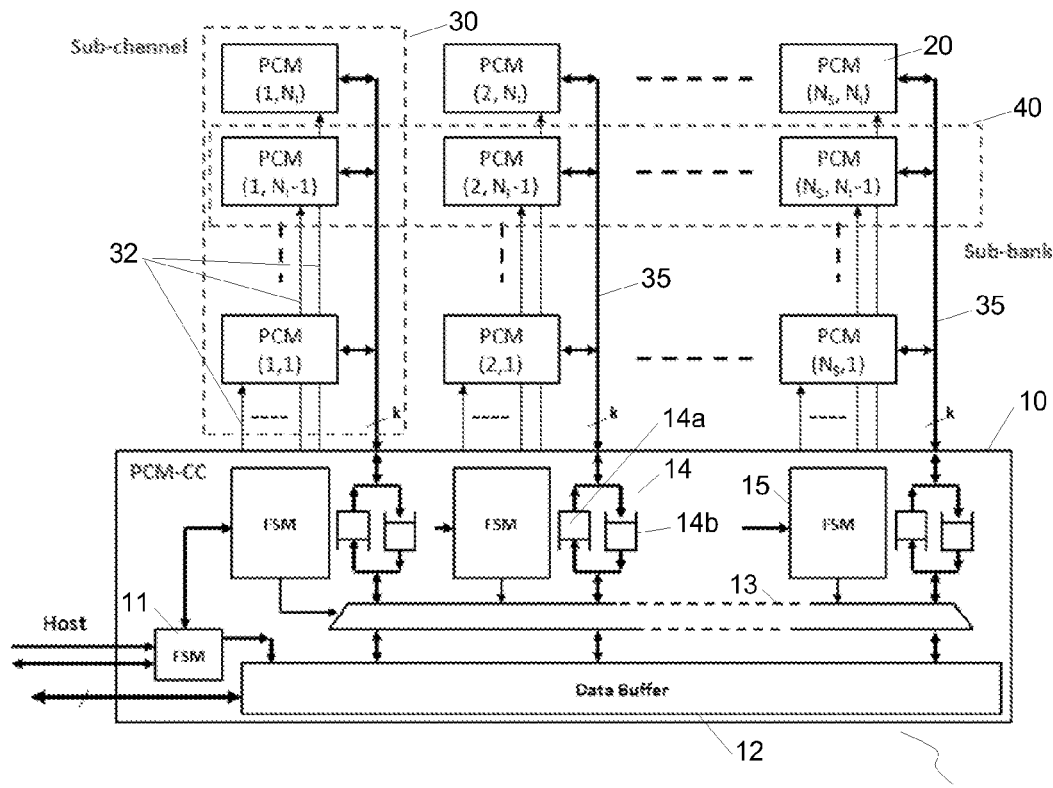
FIG. 1 is a block diagram schematically illustrating selected components of a storage device according to embodiments of the invention, which explicitly shows a matrix configuration of phase change memory integrated circuits, organized in sub-channels and sub-banks.

An aspect of the invention is first described in reference to FIG. 1, which concerns a storage device 100. Basically, the device 100 comprises a channel controller (or "CC") 10 and phase change memory integrated circuits 20 (hereinafter "PCM ICs"). These PCM ICs 20 are physically arranged in sub-channels (or "SCs") 30, where the SCs 30 altogether form a channel. Each PCM IC 20 of a given SC 30 is connected by at least one data bus line 35 (also called bus data bus line, or simply bus line) that otherwise connects to the CC 10, such that each SC 30 is connected to the CC 10. Data bus lines 35 are designed for conveying data signals.

Remarkably, the PCM ICs 20 are arranged according to a matrix configuration. That is, the CC 10 is configured to write data to and/or read data from the PCM ICs 20 according to this matrix configuration. The number of columns of this matrix configuration respectively corresponds to a number $N_s$ of the SCs 30, where $N_s \geq 2$. The number of rows of this matrix configuration respectively corresponds to a number $N_l$ of sub-banks (hereinafter "SBs") 40, where $N_l \geq 2$. The SBs 40 altogether form a bank. FIG. 1 shows the matrix configuration subtended by sub-channels and sub-banks: each SB 40 comprises PCM ICs 20 that belong, each, to distinct SCs 30.

In other words, the PCM ICs 20 are physically arranged in sub-channels 30. Yet, from the viewpoint of the CC's 10 logic, the PCM ICs 20 are arranged according to a 2D configuration or architecture, which can be regarded as a matrix arrangement, wherein columns correspond to SCs 30 and rows correspond to SBs 40, such that each SB 40 comprises PCM ICs 20 that belong, each, to distinct SCs 30. A 2D architecture of SCs vs. SBs results, which configuration is exploited by the CC 10 to write data to and/or read data from the PCM ICs 20. To that aim, the CC 10 is equipped with suitable computerized methods that effectively use this configuration to read/write data. The CC 10 makes use of physical connections 35 (data bus lines) and may, preferably, further require control bus lines 32, as discussed below in detail.

Where the above 2D architecture of PCM ICs 20 becomes advantageous is that the numbers of rows and columns can be optimized in order to optimize the read vs. write performances, as present inventors have realized. As discussed in more detail below, the optimization can be static (i.e., be performed during the design phase, before the run-time) or dynamic (some optimization may take place at run-time). Thus, the read vs. write performances can be optimized by adjusting the matrix configuration. This configuration can be any intermediate configuration between (yet excluding) the following extreme configurations: (i) a configuration that involves a single SB 40, which optimizes the read performance; and (ii) a single SC 30 configuration, which optimizes the write performance. Accordingly, an improved, ideally an optimal configuration can be obtained, which involves multiple rows and columns (not necessarily of equal size) and be used to achieve a desired balance between read and write performances.

It is preferred to have all PCM ICs 20 of a given SC 30 connected by a same data bus line 35 (as is the case in FIG. 1), which otherwise connects to the CC 10. This way, the PCM ICs 20 of a same SC 30 effectively share the same resources (e.g., in terms of IO pins). They share same data signals sent from and/or received by the CC 10 (at least where only one data bus line is involved per sub-channel). Having a same data bus line 35 shared by all PCM ICs 20 of a SC 30 allows to drastically simplify the hardware. The hardware complexity would otherwise be much less practical and affordable.

Preferably, the CC 10 is configured to both write data to and read data from the PCM ICs 20. Similar logics, albeit reversed, are preferably used to write and read.

Figure 4:
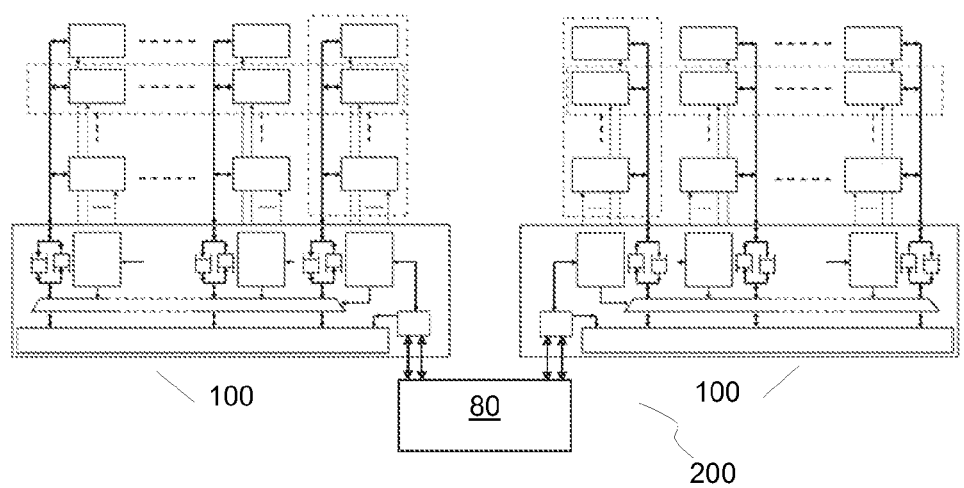
FIG. 4 is a block diagram schematically depicting a storage apparatus comprising two storage devices such as depicted in FIG. 1, according to embodiments.

Preferred implementations of such a storage device make use of PCI-e cards. Such implementations typically involve multiple CCs, as illustrated in FIG. 4, which connect to a host system using the PCI-e interface.

In exemplary embodiments, the number $N_l$ of SBs 40 is larger than or equal to 3. Preferably, $N_l = N_s$. For instance, a 3×3 configuration was satisfactorily tested by the present inventors. Such a configuration was found optimal in view of the specific properties of the PCM ICs used on that occasion, i.e., P5Q PCM ICS from Micron®. Such a configuration was furthermore convenient for prototyping purposes. However, it may clearly be suboptimal for other PCM ICs, and in particular for future generations of PCM chips.

In preferred embodiments, each SC 30 comprises several PCM ICs 20 that are connected to the CC 10 by respective control bus lines 32, as illustrated by thin arrows in FIG. 1. In that case, the CC 10 is configured to write data to and/or read data from the PCM ICs 20, using the data bus lines 35 (data are written and read by way of data signals conveyed via the data bus lines 35). Yet, control signals are used, which are conveyed via the control bus lines 32, to select and/or identify the SBs 40 to which data is to be written and/or the SBs 40 from which data is to be read. "Control signals" and "data signals" are standard terminologies. Control signals correspond to commands and data signals convey actual data. Data signal are associated to given control signals.

Therefore, in such embodiments, the controller 10 is functionally connected to the PCM ICs 20 via both control bus lines 32 and data bus lines 35. The CC 10 instructs to write and/or read data, using the control signals to discriminate amongst the SBs 40, i.e., to select/identify the SBs 40 to/from which data is to be written/read, respectively. Therefore, PCM ICs 20 that belong to a same SB 40 are controlled by (i.e., are subjected to) same or functionally similar control signals that are sent from or received by the CC 10. Preferably, PCM ICs of a same SB 40 share same control signals, for simplicity.

Figure 2:
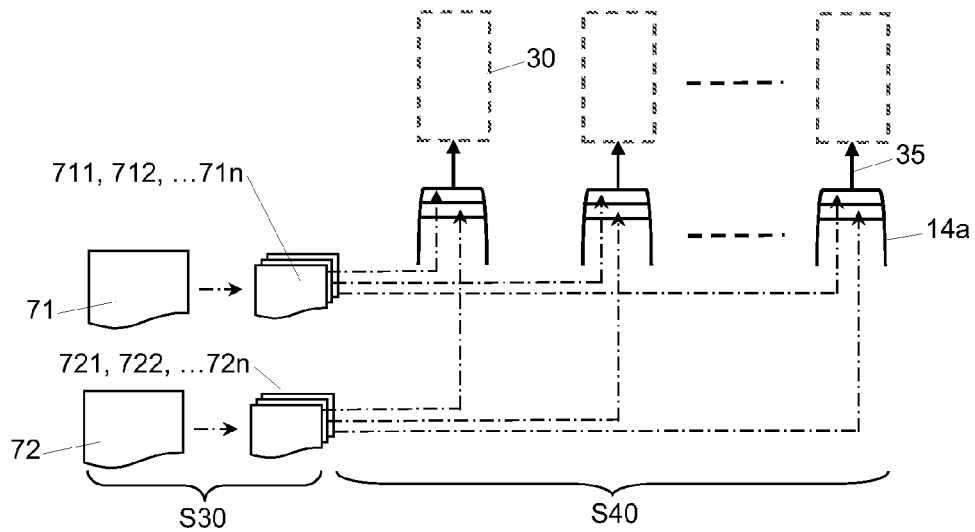
FIG. 2 is a diagram illustrating how data chunks can mapped onto sub-channels of a storage device as in FIG. 1, to ease the selection of sub-banks whereon data will be stored, as involved in embodiments.

In principle, owing to the present 2D architecture used, two types of control signals are needed to select or identify the PCM ICs 20 where data chunks will ultimately need to be transported to write or from read. However, the CC 10 may advantageously actually use an implicit mapping, which allows to skip one of these two types of control signals, as illustrated in FIG. 2. When such an implicit mapping is used, only one type of control signal suffices to discriminate amongst SBs 40. This is discussed later in more detail.

Still, it is noted that control signals may not always be necessary. For instance, embodiments can be contemplated where separate data bus lines are provided for PCM ICs 20 of a same SC 30, i.e., data bus lines 35 individually connect PCM ICs 20 of a given SC 30. In such a case, one understands that no control signal is required to select/identify the SB 40 where data are to be written to/read from; data is conveyed via the relevant data bus line 35.

For completeness, PCM ICs 20 typically involve, each, several PCM cells. In this respect, the set of PCM ICs 20 of a same SB 40 preferably share a same addressing space, which determines where in the ICs the data chunks are stored. Now, explicit addresses could otherwise be conveyed though the data bus lines. In other variants, explicit addresses could also be included in the control signals.

Accordingly, the PCM channel formed by the sub-channels 30 can be regarded as a set of sub-channels 30 that can be accessed in parallel by the CC 10, resulting in a same number of data transfers per sub-channel. Equivalently, this PCM channel can be regarded as a set of sub-banks 40 that can be accessed simultaneously (e.g., during a same logical writing step), resulting in parallel data transfers on the same address space.

In embodiments, and as illustrated in FIG. 2, the CC 10 is configured at least to write data to the PCM ICs 20, according to said matrix configuration, it being reminded that the CC 10 is more preferably able to both read and write data. To write data into the PCM ICs 20, the CC 10 may be configured to perform the following two steps: (i) break some given data 71, 72 (data to be written to the PCM ICs) into data chunks 711 . . . 71n, 721 . . . 72n; and (ii) buffer data chunks 711 . . . 71n, 721 . . . 72n obtained according to the data bus lines 35, i.e., consistently with the SBs 40 to which said given data 71, 72 is to be written. Then, the CC 10 may instruct to write buffered data chunks to intended SBs 40, using control signals conveyed in the control bus lines 32.

Figure 5:
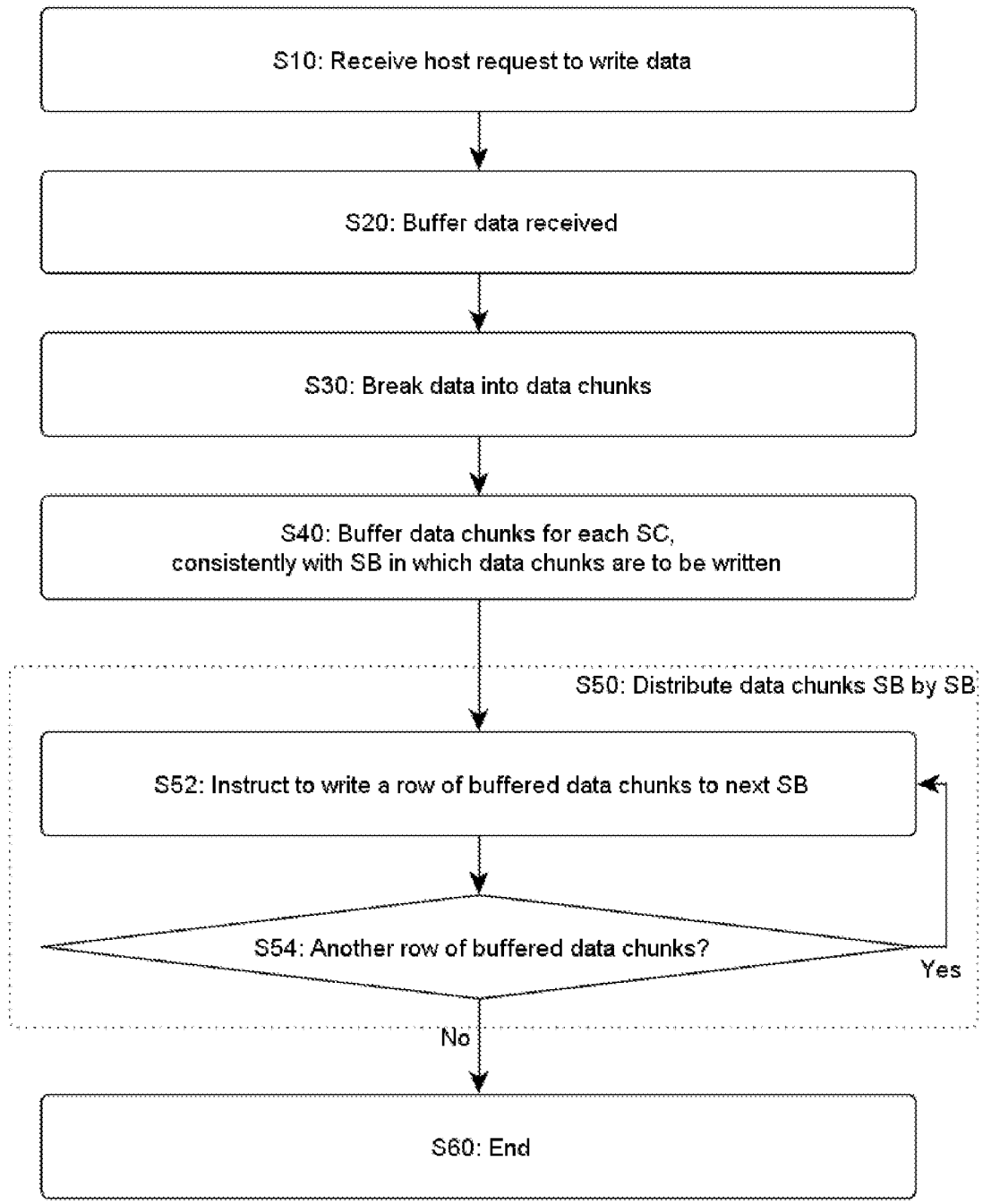
FIGS. 5 and 6 are flowcharts illustrating steps of methods of writing data to and reading data from a storage device as depicted in FIG. 1, according to embodiments.

For example, and as illustrated in FIG. 2, assume that one wants to write a data sector 71. This data sector 71 is first broken into data chunks 711, 712, . . . 71n, which also corresponds to step S30 in the flowchart of FIG. 5. The skilled person will appreciate that such a step markedly differs from what is implemented in flash memory. Data chunks 711, 712, . . . 71n are then buffered in a "modulo" fashion, across the queues 14a, such that data chunks 711, 712, . . . 71n to be written in a same sub-bank 40 are buffered in parallel queues 14a. As further illustrated in FIG. 2, distinct queues 14a are otherwise provided for each data bus lines 35 or SC30. The data chunks 711, 712, . . . 71n to be written in a same sub-bank 40 may typically be placed at a same "level" in the parallel queues 14a, as shown in FIG. 2. The data chunks 721, 722, . . . 72n that arises from a next data sector 72 are similarly queued at a next level in the queues 14a.

In other words, the CC 10 pre-aligns the data chunks 711 . . . 71n, 721 . . . 72n with respect to the data bus lines 35 (and therefore with respect to the correspondingly served SCs 30). In this way, an implicit mapping of the data chunks vs. SBs is achieved, which results in that the corresponding control signals to be sent via the control bus lines 32 will just need to discriminate amongst SBs 40, in order to store the data chunks 711 . . . 71n, 721 . . . 72n in determined PCM ICs 20.

The queues 14a typically use a FIFO logic, so that contiguous data chunks are typically placed at a same level in each queue 14a, as assumed in FIG. 2. Since data chunks of several sectors are queued, each queue 14a will actually form a queue of buffers (at least in this example). Preferably, the number of data chunks 711 . . . 71n, 721 . . . 72n corresponding to a single sector is proportional to the number of sub-channels 30, by design, whence the implicit mapping proposed in FIG. 2. Yet, more generally, how the data chunks 711 . . . 71n, 721 . . . 72n are effectively placed in the queues 14a and then in the SBs 40 shall depend on the number of data chunks vs. the number $N_s$ of SCs 30, and possibly the number $N_l$ of SBs 40 too, as well as the actual mapping strategy chosen. Optimal values for the number of data chunks 711 . . . 71$n$, 721 . . . 72$n$ and the number of sub-channels 30 may depend on the data chunk size chosen, which can be a function of the capability of the PCM chip, the number of pins (data lines) supported, the latency target, etc.

As furthermore illustrated in FIG. 1, the read/write logic may be implemented by way of Finite State Machines (FSMs). Since, in the example of FIG. 1, FSMs 15 maintain state information about each SC 30, one understands that more elaborate mappings and data chunk placement strategies may be contemplated, which can use such state information to effectively read/write data. In addition, in the example of FIG. 1, the FSM 11 maintains higher-level information with respect to FSMs 15. This FSM 11 can be a complex FSM, implementing advanced mapping strategies, for example for wear leveling purposes, using the matrix configuration to be optimally exploited by the CC 10.

What the CC 10 performs, more generally, when writing data, is to distribute the data chunks 711 . . . 71$n$, 721 . . . 72$n$, sub-bank by sub-bank for subsequent writing, which preferably involves a pre-alignment of data chunks, as described above. Consistently with the 2D configuration adopted here, first data chunks are instructed to be written to a first SB before instructing to write second data chunks to a second SB. Advantageously, said second data can be instructed to be written to the second SB, before completion of the first data writing.

Figure 3:
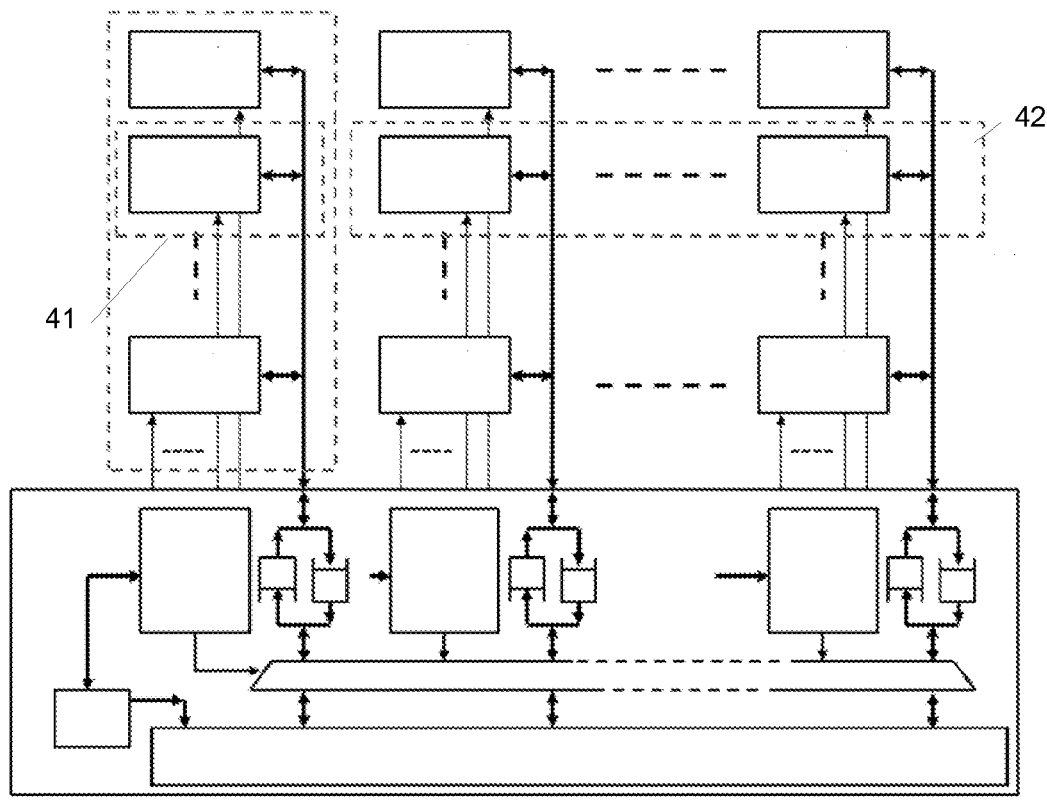
FIG. 3 is a block diagram similar to that of FIG. 1, except that the matrix configuration now includes two sub-banks on a given row of the matrix configuration, as involved in embodiments.

For completeness, in the particular embodiment of FIG. 1, reference 12 denotes a data buffer (used when receiving/sending data to a host), reference 13 denotes a bus internal to the CC 10, and reference 14 denotes queues 14$a$ used for writing data (as exemplified in FIG. 2), whereas queues 14$b$ are conversely used upon reading data. In FIGS. 1, 3 and 4, the thin arrows represent control signals conveyed through control bus lines 32, which allows relevant SBs 40 to be selected/identified, while thick arrows represent actual data signals, conveyed through data bus lines 35. The width of the data line (denoted by k in FIG. 1) is typically 8 or 16 bits.

So far, essentially the write operations have been described in detail. More shall now be said about read operations. In that respect, the CC 10 may be configured at least to read data from the PCM ICs 20, again using said matrix configuration. To that aim, the CC 10 may be configured to perform the following operations:
 (i) instruct to read data chunks SB by SB, using control signals conveyed in the control bus lines 32, such that data chunks in one SB are instructed to be read before instructing to read data chunks of another SB; and
 (ii) re-assemble the data chunks read.

Data chunks read are typically re-assembled into data sectors (also data blocks), or into any suitable data grain, depending on the data formats used.

The reading scheme is consistent with the write scheme discussed earlier: data chunks are read SB by SB; they can, for instance, be stored in queues 14$b$, prior to re-assembling data. Again, FSMs 11, 15 may be provided to implement all the necessary logic, although other processing means could be contemplated.

At present, more complex 2D configurations shall be discussed in reference to FIG. 3. Such complex configurations could be used both for writing and reading data. The matrix configuration may include at least two SBs 41, 42 on one or more given rows. For example, in FIG. 3, two SBs 41, 42 comprise two distinct sets of PCM ICs, such that said two SBs 41, 42 do not share same control signals. In other words, two SBs 41, 42 on a same row may comprise two distinct sets of PCM ICs, wherein PCM ICs of these two sets belong to distinct SCs of the $N_s$ SCs. Thus, these two SBs 41, 42 do not share the same control signals sent from or received by the CC 10. The necessary control signals shall be conveyed in distinct sets of control bus lines 32, consistently with the split of sub-banks assumed here.

Such variants allow storing of a data sector across different numbers of PCM ICs 20 in a same row and, in turn, gives some room to not overload the SBs 40. However, these variants introduce additional complexity in the underlying logic. It remains simpler to use SBs 40 that have a same predetermined size in terms of PCM ICs 20, as shown in FIG. 1.

In other embodiments, the CC 10 may be further configured to exclude a subset of SBs, when writing data across the SBs, wherein said subset of SBs is preferably predetermined. Such a mechanism can be implemented for sub-banks having a fixed, uniform size (e.g., full-row) or for sub-banks that have non-uniform sizes (like in FIG. 3), or even for sub-banks whose sizes dynamically vary. In all cases, the aim is to limit the spread of the logical data pages/sectors being written across SBs, in order to subsequently improve the read performances when these data are read. By excluding rows, one reduces the number of SBs and therefore effectively increases the ratio of SCs-to-SBs, which improves the subsequent read performances. When excluding only portions of rows, as implemented in reference to FIG. 3, one also effectively reduces the number of SBs mapped onto such portions and therefore effectively increases the ratio of SCs-to-SBs, which therefore also allows for adjusting the write vs. read performances.

As discussed earlier, the CC 10 does not need to wait for the completion of a write/read operation to instruct to write to/read from a next SB 40. Therefore, the CC 10 may instruct, while first data are being written to or read from a first SB, to respectively write second data to or read second data from a second SB. This results in a "pipelining" effect, i.e., a time overlap in data transfers and storage procedures over different SBs. Accordingly, both a write performance gain and a read performance gain can be achieved by the storage device 100, thanks to this pipelining. It should, however, be realized that these additional advantages add to the advantages already provided by the 2D configuration of PCM ICs 20, in terms of adjustment of the write vs. read performances. Thus, a gain increase is achieved due to pipelining, in addition to the write vs. read performance gain achieved due to the present 2D architecture of PCM ICs 20.

Embodiments of the present invention can be implemented at the chip level and/or at the board level. Namely, a 2D configuration as shown in FIG. 1 can be implemented within a PCM chip, which chip would therefore contain several PCM ICs 20 organized according to this 2D configuration, as well as a chip-level channel controller. On the other hand, multiple PCM chips can be organized using the 2D configuration on a board level, using a board-level channel controller.

In that respect, and referring now to FIG. 4, the invention can further be embodied as a storage apparatus 200 that involves two or more storage devices 100 as described above, e.g., to enable a board-level implementation. The apparatus 200 typically comprises a data storage controller 80 (e.g., a board-level channel controller) connected to each CC 10 of the storage devices 100. This allows to parallelize data writing and take advantage of the implicit data mapping discussed earlier, which can increase as the number of constituting devices 100 increase.

Figure 7:
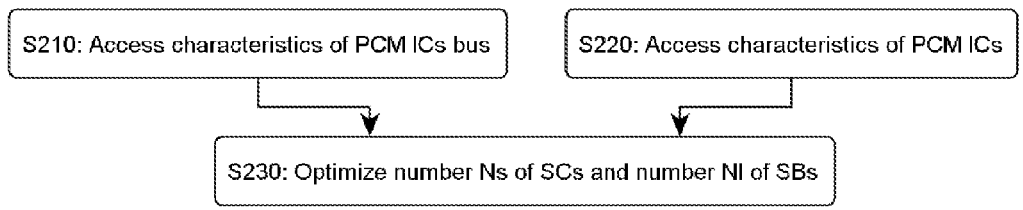
FIG. 7 is a flowchart illustrating high-level steps of a method of optimizing a storage device such as depicted in FIG. 1, according to embodiments.

According to another aspect and as discussed earlier, the present invention can further be embodied as a method for optimizing storage devices 100 as described above. In reference to FIG. 7, such method basically consists in optimizing S230 the number $N_s$ of SCs 30 and/or the number $N_l$ of SBs 40 in the matrix arrangement, based on characteristics S210, S220 of the PCM ICs 20. This optimization typically takes place during the design phase, i.e., before run-time. However, it can also be implemented at run-time. For example, and as mentioned earlier, some SBs 40 could be purposely discarded by the CC 10 at run-time.

This optimization may furthermore take into account bus characteristics, e.g., the data bus lines 35 and/or the control bus lines 32. For example, this optimization can advantageously be carried out based on the following characteristics:

The number ($N_D$) of pins used for the data bus of the PCM ICs 20 (e.g., ND=x 8);
The number of pins used for interface control;
The clock frequency (F) for transferring data (in MHz);
The transfer rate coefficient c, that is, the ratio between the internal clock rate of the PCM ICs 20 and the clock rate of the data bus (c≥1, e.g., 2 for DDR2);
The time ($T_W$) required to store data on the PCM cells of a PCM IC 20, from a buffer of the CC 10 (in usecs); and
A time ($T_R$) required to retrieve the data from PCM cells of the PCM ICs 20 to an internal data buffer of the CC 10 (in usecs).

The reasons for specifically considering the parameters above shall be discussed in detail in the next section.

Next, and according to another aspect, the invention can further be embodied as a method of writing data to a storage device 100 as described above. Fundamental aspects of such a method have already been implicitly addressed in reference to FIGS. 1-4. Basically, and referring now to FIG. 5, this method essentially revolves around two steps, performed by the CC 10, and which consists in: (i) breaking the data to be written to the PCM ICs 20 into data chunks 711 . . . 71n, 721 . . . 72n (which corresponds to step S30 in FIG. 5); and (ii) distributing (step S50) the data chunks 711 . . . 71n, 721 . . . 72n, SB by SB, for subsequent writing, whereby first data chunks are instructed (step S52) to be written to a first SB before instructing (step S54-S52) to write second data chunks to a second SB. As stated earlier, second data can be instructed to be written to the second SB before completion of the first data writing.

As discussed earlier and further reflected in FIG. 5, it is advantageous to buffer S40 data chunks 711 . . . 71n, 721 . . . 72n according to the data bus lines 35, consistently with the SBs 40 to which the data chunks are to be written, to accordingly distribute S50 the data chunks SB by SB.

For instance, assume that the CC 10 receives (from a connected host) a given data sector of 512 bytes, step S10. Said data sector may, for instance, be buffered in the buffer 12 shown in FIG. 1, step S20. Next, the CC 10 breaks this data into 8 chunks (call them $c_1$-$c_8$) of 64 bytes each, step S30. Then, the CC 10 may start dispatching the chunks through the SBs 40, step S50. Assume that each SB 40 comprises, in this example, four PCM ICs 20 (there are four SCs). Then, the CC 10 would instruct to store the chunks pertaining to said given data sector through two SBs 40, thereby ensuring commensurateness of the data sector vs. SBs. To that aim, the CC 10 aligns (step S40) the chunks with respect to the data bus lines 35, such that $c_1$ and $c_5$ are preselected for distribution to the first SC, $c_2$ and $c_6$ are preselected for distribution to the second SC, etc. Rows of data chunks can then be distributed (step S50), SB by SB, for subsequent writing, whereby first data chunks are instructed (step S52) to be written to a first SB before instructing to write second data chunks to a next SB, according to steps S54-S52, until no further rows of buffered data chunks remains.

Chunks of data are normally stored in contiguous SBs 40. However, receiving SBs need not be contiguous, strictly speaking, provided that the CC 10 keeps record of the relevant state information, e.g., metadata necessary to correctly re-assemble the data chunks, which is, for instance, made possible due to the FSM 11, 15 in FIG. 1. Thus, one understands that more complex mapping, alignment strategies, etc., may be contemplated.

Figure 6:
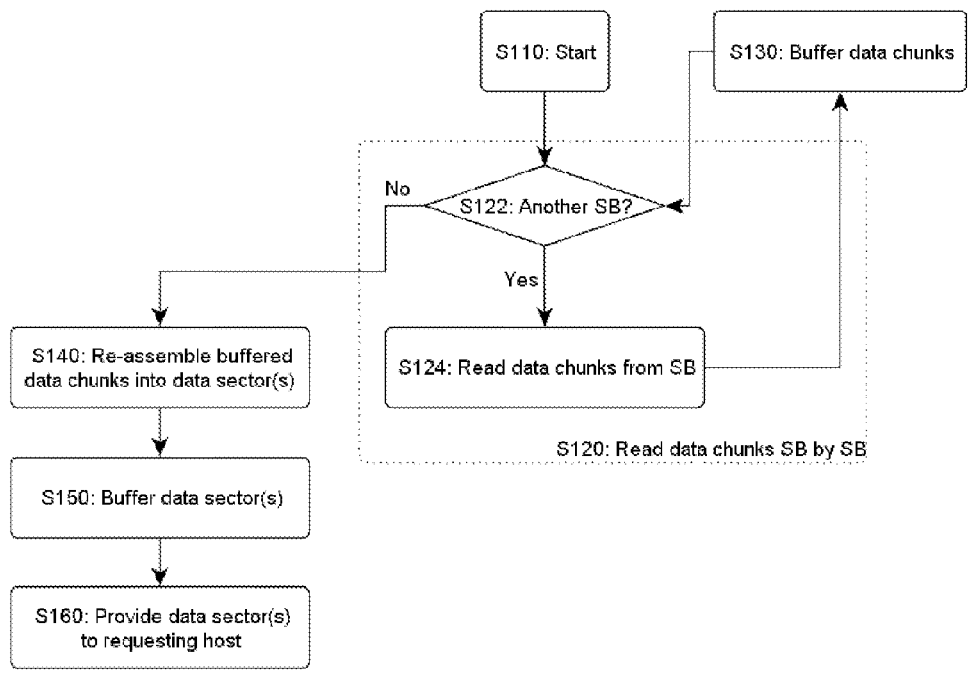

According to a further aspect, the invention can also be embodied as a method of reading data, as already implicitly addressed in reference to FIGS. 1-4. Referring now to FIG. 6, this method again revolves around two steps, performed by the CC 10, and which consists in:

(i) instructing to read S120 data chunks, SB by SB, whereby data chunks in a first SB are instructed S124 to be read before instructing S122-S124 to read data chunks of second SB;
(ii) re-assembling S140 data chunks into a data sector.

Then, the re-assembled data sector can be provided S160 to a host. Note that the re-assembly of the data step S140 in FIG. 6 may be implicit, or automatic (owing to the data collection scheme), e.g., due to the way the data chunks are buffered, step S130, after reading them SB by SB. Also, instead of explicitly providing the re-assembled data sectors (step S160) to the host, the host could simply be given access to a relevant memory location in the CC 10 memory e.g., in a large data buffer 12, where it can access the re-assembled data.

Finally, and consistently with the previous description of the storage devices 100, the above methods of writing/reading data may further comprise, at the CC 10, to use control signals conveyed in the control bus lines 32 to select/identify the SBs 40 to which data is to be written or from which data is to be read. As further discussed earlier, a set of PCM ICs 20 of a same SB 40 preferably shares the same addressing space, which implicitly determines where data chunks are to be written or to be read in the ICs of this set.

The above embodiments have been succinctly described in reference to the accompanying drawings and may accommodate a number of variants. Several combinations of the above features may be contemplated. Examples are given in the next section.

2. Specific Embodiments/Technical Implementation Details

The following, specific embodiments are again based on a new type of channel that uses multiple PCM ICs 20 in a 2D configuration. As stated earlier, the data is distributed to multiple PCM ICs 20 and is stored to different subsets of PCM ICs 20, sequentially and in parallel.

The following definitions are assumed hereafter:
User data: The data accessed by the user in the storage device (useful payload on the device);
Metadata: Additional information stored along with the user data (e.g., ECC, logical-to-physical address mapping information, etc.);
PCM page: The unit of I/O from the device controller to the memory (includes data and metadata);
PCM block: The maximum number of bytes that can be stored in a single write cycle to PCM cells of a single PCM IC;

PCM IC (or PCM chip): The integrated circuit that contains an array of PCM cells, which are accessed using a given suitable electrical interface;

Sub-channel (or "SC"): A set of PCM ICs that share same data signals;

Sub-bank (or "SB"): A set of PCM ICs that belong to different sub-channels and share the same control signals and addressing space; and PCM Channel: A set of sub-channels that can be accessed in parallel, resulting in a same number of data transfers per sub-channel. Equivalently, a set of SBs that can be accessed simultaneously, resulting in parallel data transfers on the same address space.

Each PCM IC 20 uses an internal data buffer of B bytes that can be accessed in a single (read or write) cycle. The new type of PCM channel consists of a number of PCM ICs 20, $N_I N_s$, so that $BN_I N_s$ is the size of the PCM page (or an integer sub-multiple of it). The PCM ICs 20 are organized so that subsets thereof share the same data signals (therefore they can be accessed sequentially), while other subsets can be accessed in parallel, since they share the same control signals but use different data signals. $N_I$ is the number of PCM ICs 20 that share the same data signals (they form a PCM SC), while $N_s$ is the number of PCM ICs 20 that share the same control signals (they form a PCM SB), as reflected in FIG. 1. Blocks of $BN_s$ bytes are provided sequentially to all SCs 30 and consecutive SBs 40 are loaded sequentially with user data. While the data is being stored to the PCM cells of a SB 40, data is transferred to the next SB(s) 40, thus resulting in pipelining (time overlapping of data transfers and storage procedures) over different SBs 40.

The user data, that needs to be stored in the PCM cells, is organized in blocks of B bytes. Allocation to the PCM ICs 20 is independent of the user page size. For optimum memory utilization and minimum hardware complexity, the number of blocks per user page is an integer multiple to the number of SCs 30. All SCs 30 are loaded with the same number of PCM blocks, and all SBs 40 are loaded with the same number of PCM blocks. There is a minimum number of PCM ICs 20 per SC 30 for achieving the maximum write performance. Consecutive blocks of B user bytes are allocated to consecutive SCs 30. PCM ICs 20 of the same SB 40 are loaded in a round-robin fashion.

With a given number of PCM ICs 20, and for a specific page size, increasing the number of SCs 30 (decreasing the number of SBs 40) results in improved read performance, but it may affect the write performance. On the contrary, increasing the number of SBs 40 (decreasing the number of SCs 30) may result in higher write performance, but reduces the read performance, since less data signals are used for transferring data in parallel. Therefore, the number of rows/columns (SCs/SBs) of the 2D configuration can, in principle, assume any value for a given set of PCM ICs 20, but an optimal selection may be based on the target read/write performance. In this way, the read and write performance is "adjustable", between (yet excluding) a maximum read performance (single SB configuration) and a maximum write performance (single SC configuration). A configuration with multiple rows and columns (not necessarily of equal size) can be used for achieving the required balance between read and write performance.

During the design of a high-performance solid-state drive (SSD) with a single chip controller and a specific PCM technology, the total number of available I/O pins may be taken into account in order to determine the proper channel configuration and the best SSD architecture. In some cases, reducing the performance of the single PCM channel (i.e., using a smaller number of data pins, thus increasing the data transfer time) may result in higher performance at the complete SSD level, for instance, if this allows a higher number of PCM channels to be used. The following analysis explains how that can be achieved.

We consider a PCM IC 20 that uses a number of I/O pins for data access and control. Concerning the PCM IC 20, the following definitions apply:

$N_D$: The number of pins used for IC's data bus ($N_D$=x8);

$N_C$: The number of pins used for interface control;

F: The clock frequency for transferring data (in MHz);

c: Transfer rate coefficient (c≥1, i.e. 2 for DDR2);

$T_W$: The time required to store the data from the internal data buffer to the PCM cells (in usecs); and $T_R$: The time required to retrieve the data from the PCM cells to the internal data buffer (in usecs).

According to the above parameters, the read/write performance of this IC is given by:

(i) The PCM IC sustained write rate:

$$R_{SW} = R_A \frac{T_T}{T_T + T_W};$$

and (ii) The PCM IC sustained read rate:

$$R_{SR} = R_A \frac{T_T}{T_T + T_R},$$

Where:

$$T_T = \frac{8B}{cFN_D}$$

is the transfer time of a block of B bytes (usecs), and $$R_A = \frac{cFN_D}{8}$$

is the transfer rate at the IC's interface (MBps).

In PCM technology, $T_R \cong 0$ and, in this case, $R_{SR}=R_A$ and $$R_{SW} = R_{SR} \frac{T_T}{T_T + T_W}.$$

In many PCM ICs 20, the data transfer time is much shorter than the data write time ($T_T \ll T_W = kT_T$). Parameter k is a basic parameter of the present analysis, since its value, $$k = \frac{cFN_D T_W}{8B},$$

is determined by the PCM technology used and the PCM IC's 20 electrical interface, and characterizes write compared to read, since $$R_{SW} = R_{SR}\frac{1}{1+k}.$$

Table I below presents some illustrative examples of current and future PCM ICs 20 and the respective k values.

TABLE I

|  | Case #1 | Case #2 | Case #3 | Case #4 | Case #5 |
|---|---|---|---|---|---|
| Data buffer B [bytes] | 64 | 64 | 64 | 256 | 1024 |
| Data bus width $N_D$ | 2 | 8 | 16 | 16 | 16 |
| Interface Clock F [MHz] | 66 | 100 | 100 | 100 | 200 |
| Transfer rate coefficient c | 1 | 2 | 2 | 2 | 2 |
| PCM write time $T_W$ [usecs] | 120 | 20 | 20 | 20 | 20 |
| Parameter [k] | 30 | 62 | 124 | 31 | 15 |

The above analysis confirms that, to design a high performance SSD with a high read and write performance, a new architecture for the basic storage channel is needed, as is an SSD architecture that exploits it.

Let define $P_B$ as the total number of pins available for interconnecting the PCM memory chips with the single-chip controller of the SSD. For the sake of comparison, in the next paragraphs, the performance of SSDs uses (i) a basic configuration (no pipelining, no 2D architecture), (ii) a configuration allowing for pipelining, and (iii) a 2D architecture as proposed herein.

(i) A basic SSD configuration would use a set of single chip channels. In this case, the SSDs' sustained data rates are given by:

A typical SSD sustained write rate:

$$R_{SSD_W} = \left\lfloor\frac{P_B}{N_D + N_C}\right\rfloor\frac{cFN_D}{8}\frac{1}{1+k};$$

and
A typical SSD sustained read rate:

$$R_{SSD_R} = \left\lfloor\frac{P_B}{N_D + N_C}\right\rfloor\frac{cFN_D}{8},$$

where $$\left\lfloor\frac{P_B}{N_D + N_C}\right\rfloor$$

is the maximum number of PCM channels supported by the SSD controller.

(ii) When pipeline per channel is used ($N_p$ is the pipeline depth), the maximum number of PCM channels is given by $$\left\lfloor\frac{P_B}{N_D + N_C + N_p - 1}\right\rfloor$$

(assuming $N_p T_T \leq T_W$) and the SSD's sustained data rates become:

Pipeline sustained write rate:

$$R_{P_W} = \left\lfloor\frac{P_B}{N_D + N_C + N_p - 1}\right\rfloor\frac{cFN_D}{8}\frac{N_p T_T}{T_T + T_W}\left\lfloor\frac{P_B}{N_D + N_C + N_p - 1}\right\rfloor\frac{cFN_D}{8(1+k)}N_p;$$

and
Pipeline sustained read rate $$R_{P_R} = \left\lfloor\frac{P_B}{N_D + N_C + N_p - 1}\right\rfloor\frac{cFN_D}{8}.$$

Comparing the above equations, it can be concluded that pipeline may slightly reduce the read performance, but it improves significantly the write sustained data rate, since it reduces the effect of the high write time.

(iii) Now, due to the presently proposed 2D architecture, the maximum number of ICs that can be connected per SSD is given by:

$$M = \left\lfloor\frac{P_B}{N_S N_D + N_C + N_l - 1}\right\rfloor.$$

The maximum number of available SBs, $N_l$, is selected so that $N_l T_T \leq T_W$, since values of $N_l$ higher than [k] do not further improve the write performance. The number of SBs 40 used in the 2D architecture is equivalent to the pipeline approach described above. Other limiting factors for the selection of $N_l$ may notably be the driving capabilities of the I/O pads of the SSD controller, and the technology used in the electrical interface of the PCM ICs 20.

The SSD performance is given by:
The SSD sustained write rate:

$$R_{2D_W} = \left\lfloor\frac{P_B}{N_S N_D + N_C + N_l - 1}\right\rfloor\frac{cFN_D}{8(1+k)}N_S N_l;$$

and
The SSD sustained read rate:

$$R_{2D_R} = \left\lfloor\frac{P_B}{N_S N_D + N_C + N_l - 1}\right\rfloor\frac{cFN_D}{8}N_S$$

Normalizing the sustained data rates of the pipeline ("PL") and the 2D architecture ("2D") to the sustained data rates of the typical SSD architecture, the following performance gains are obtained:
For the write Gain:

$$G_{PL_W} = \frac{\left\lfloor\frac{P_B}{N_D + N_C + N_p - 1}\right\rfloor}{\left\lfloor\frac{P_B}{N_D + N_C}\right\rfloor}N_p \text{ vs. } G_{2D_W} = \frac{\left\lfloor\frac{P_B}{N_S N_D + N_C + N_l - 1}\right\rfloor}{\left\lfloor\frac{P_B}{N_D + N_C}\right\rfloor}N_S N_l;$$

and

For the read Gain:

$$G_{PL_R} = \frac{\left\lfloor \frac{P_B}{N_D + N_C + N_P - 1} \right\rfloor}{\left\lfloor \frac{P_B}{N_D + N_C} \right\rfloor} \text{ vs. } G_{2D_R} = \frac{\left\lfloor \frac{P_B}{N_s N_D + N_C + N_I - 1} \right\rfloor}{\left\lfloor \frac{P_B}{N_D + N_C} \right\rfloor} N_s.$$

Now, comparing the proposed 2D architecture with a pipeline configuration, the following performance gains are calculated when $N_p = N_l$:

Write Gain:

$$G_W = \frac{\left\lfloor \frac{P_B}{N_s N_D + N_C + N_I - 1} \right\rfloor}{\left\lfloor \frac{P_B}{N_D + N_C + N_P - 1} \right\rfloor} N_s;$$

and
Read Gain:

$$G_R = \frac{\left\lfloor \frac{P_B}{N_s N_D + N_C + N_I - 1} \right\rfloor}{\left\lfloor \frac{P_B}{N_D + N_C + N_P - 1} \right\rfloor} N_s.$$

Next, the following results illustrates how a proper parameterization of the 2D architecture can improve the SSD performance.

A PCM IC 20 is considered with the following parameters: $N_C=5$, $N_D=8 \vee 16$, k=12, while the SSD controller supports 32 channels for $N_D=8$ ($P_B=416$). In this case, the number of channels supported, when pipeline and a 2D PCM IC configuration are used, is given in table II below:

TABLE II

| $N_P$ ($N_I$) | 1 | 2 | 3 | 4 | 6 | 12 |
|---|---|---|---|---|---|---|
| $N_S$ | 12 | 6 | 4 | 3 | 2 | 1 |
| Number of pipeline channels | 32 | 29 | 27 | 26 | 23 | 17 |
| Number of 2D channels | 4 | 7 | 10 | 13 | 16 | 17 |

With such parameters, the various gains as defined above can easily be computed and plotted. Examining the computed gains, it can be concluded that using only pipeline results in improved write performance. Yet, the read performance drops as the pipeline depth increases. Next, when using the proposed 2D architecture, at least some of the configuration parameters result simultaneously in better read and write performance compared either to the typical (prior art) or to the sole pipeline configuration.

For practical reasons, and as explained above, the pipeline depth takes small values, especially when high data rates are used at the PCM chip interface. In such a case, the proposed 2D architecture demonstrates significantly improved performance for both read and write operations.

When e.g., $N_D=16$, the number of typical channels supported by the controller decreases (it becomes 19 instead of 32) and the number of channels supported, when pipeline and 2D are used, is given in Table III below:

TABLE III

| $N_P$ ($N_I$) | 1 | 2 | 3 | 4 | 6 | 12 |
|---|---|---|---|---|---|---|
| $N_S$ | 12 | 6 | 4 | 3 | 2 | 1 |
| No of pipeline channels | 19 | 18 | 18 | 17 | 16 | 13 |
| No of 2D channels | 2 | 4 | 5 | 7 | 9 | 13 |

The above gains' expressions can be computed with these new parameters. What resorts is that increasing the clock frequency at the PCM interface or the data width results in shorter transfer time, but has minor effect on the sustained data rate of the PCM channel, since the dominant factor is the high write time. The drawback of increasing the data width in an SSD is that, for the same pin budget, the number of PCM channels decreases, thus resulting in significantly lower write performance.

In other embodiments, and as discussed earlier, the proposed 2D architecture can, on the one hand, be implemented at the chip level, i.e., a 2D configuration as shown in FIG. 1 is implemented within a PCM chip (which therefore contains several PCM memory ICs organized according to this 2D configuration). On the other hand, multiple PCM chips can be organized using the 2D configuration on a board level, as assumed in FIG. 1. A 2D architecture as described above has, for instance, been applied to PCM ICs 20 with dual synchronous serial interface. The PCM IC 20 has an internal buffer of 64 bytes and the typical write time is 120 usecs. In both cases, a chip or a board may exhibit PCM ICs 20 that obeys a 2D architecture, according to embodiments of the present invention. These approaches (chip level and board-level implementations) can even be combined (PCM ICs inside PCM chips are subjected to a 2D architecture and the chips themselves obey a 2D architecture), resulting in to even better performance optimization.

Computerized devices can be suitably designed for implementing embodiments of the present invention as described herein. In that respect, it can be appreciated that the methods described herein are largely non-interactive and automated. In exemplary embodiments, the methods described herein can be implemented either in an interactive, partly-interactive or non-interactive system. The methods described herein can at least partly be implemented in software (e.g., firmware), hardware, or a combination thereof. In exemplary embodiments, the methods described herein are implemented in software, as an executable program, the latter executed by suitable digital processing devices. More generally, embodiments of the present invention can be implemented wherein general-purpose digital computers or dedicated processing units are used.

Aspects of the present invention are described above with reference to flowchart illustrations and/or block diagrams of methods, apparatus (systems) and computer program products according to embodiments of the invention. It will be understood that each block of the flowchart illustrations and/or block diagrams can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

While the present invention has been described with reference to a limited number of embodiments, variants and the accompanying drawings, it will be understood by those skilled in the art that various changes may be made and equivalents may be substituted without departing from the scope of the present invention. In particular, a feature (device-like or method-like) recited in a given embodiment, variant or shown in a drawing may be combined with or replace another feature in another embodiment, variant or drawing, without departing from the scope of the present invention. Various combinations of the features described in respect of any of the above embodiments or variants may accordingly be contemplated, that remain within the scope of the appended claims. In addition, many minor modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, a channel controller may be any processing unit capable of organizing write/read operations as described hereinbefore.

The invention claimed is:

1. A method for optimizing a storage device, comprising:
    connecting, by at least one data bus line, phase change memory integrated circuits (PCM ICs) to a channel controller, wherein the PCM ICs are arranged in sub-channels and each of the sub-channels comprises several PCM ICs corresponding to a respective finite state machine within the channel controller; and
    optimizing a plurality of the sub-channels and/or a plurality of sub-banks in a matrix configuration, based on characteristics of the PCM ICs;
    wherein the channel controller is configured to write data to and/or read data from the PCM ICs according to the matrix configuration of PCM ICs, wherein:
    a plurality of columns of the matrix configuration respectively corresponds to the plurality of the sub-channels, the plurality of the sub-channels forming a channel; and
    a plurality of rows of the matrix configuration respectively corresponds to the plurality of sub-banks, the plurality of sub-banks forming a bank, wherein each of the plurality of sub-banks comprises PCM ICs that each belong to distinct sub-channels of the plurality of the sub-channels.

2. The method of claim 1, wherein optimizing is furthermore carried out based on characteristics of a bus that comprises said at least one data bus line.

3. The method of claim 1, further comprising instructing, while first data is being written to or read from a first sub-bank of the plurality of sub-banks, to write second data to or read second data from a second sub-bank of the plurality of sub-banks.

4. The method of claim 1, further comprising:
    breaking data to be written to the PCM ICs into data chunks; and
    distributing the data chunks sub-bank by sub-bank for subsequent writing, such that first data chunks are instructed to be written to a first sub-bank before instructing to write second data chunks to a second sub-bank.

5. The method of claim 4, further comprising:
    buffering the data chunks according to the at least one data bus line, consistently with sub-banks to which the data chunks are to be written, to distribute the data chunks sub-bank by sub-bank.

6. The method of claim 4, further comprising, at the channel controller:
    using control signals conveyed in control bus lines to select or identify sub-banks to which data is to be written, and wherein a set of PCM ICs of a same sub-bank share a same addressing space, which determines where data chunks are to be written in the set of PCM ICs.

7. The method of claim 1, further comprising, at the channel controller:
    instructing to read data chunks sub-bank by sub-bank, whereby data chunks in a first sub-bank are instructed to be read before instructing to read data chunks of a second sub-bank;
    re-assembling the data chunks into a data sector; and
    providing the re-assembled data sector to a host.

8. A method of writing data to a storage device, comprising:
    connecting, by at least one data bus line, phase change memory integrated circuits (PCM ICs) to a channel controller, wherein the PCM ICs are arranged in sub-channels and each of the sub-channels comprises several PCM ICs; and
    at the channel controller:
        breaking data to be written to the PCM ICs into data chunks; and
        distributing the data chunks sub-bank by sub-bank for subsequent writing, such that first data chunks are instructed to be written to a first sub-bank before instructing to write second data chunks to a second sub-bank;
    wherein the channel controller is configured to write data to and/or read data from the PCM ICs according to a matrix configuration of PCM ICs, wherein:
    a plurality of columns of the matrix configuration respectively corresponds to a plurality of the sub-channels, the plurality of the sub-channels forming a channel; and
    a plurality of rows of the matrix configuration respectively corresponds to a plurality of sub-banks, the plurality of sub-banks forming a bank, wherein each of the plurality of sub-banks comprises PCM ICs that each belong to distinct sub-channels of the plurality of the sub-channels.

9. The method of claim 8, further comprising:
    buffering the data chunks according to the at least one data bus line, consistently with sub-banks to which the data chunks are to be written, to distribute the data chunks sub-bank by sub-bank.

10. The method of claim 8, wherein the method further comprises, at the channel controller:
    using control signals conveyed in control bus lines to select or identify sub-banks to which data is to be written, and wherein a set of PCM ICs of a same sub-bank share a same addressing space, which determines where data chunks are to be written in the set of PCM ICs.

11. A method of reading data from the storage device, comprising:
    connecting, by at least one data bus line, phase change memory integrated circuits (PCM ICs) to a channel controller, wherein the PCM ICs are arranged in sub-channels and each of the sub-channels comprises several PCM ICs; and
    at the channel controller:
        instructing to read data chunks sub-bank by sub-bank, whereby data chunks in a first sub-bank are instructed to be read before instructing to read data chunks of a second sub-bank;

re-assembling the data chunks into a data sector; and
providing the re-assembled data sector to a host;
wherein the channel controller is configured to write data to and/or read data from the PCM ICs according to a matrix configuration of PCM ICs, wherein:
a plurality of columns of the matrix configuration respectively corresponds to a plurality of the sub-channels, the plurality of the sub-channels forming a channel; and
a plurality of rows of the matrix configuration respectively corresponds to a plurality of sub-banks, the plurality of sub-banks forming a bank, wherein each of the plurality of sub-banks comprises PCM ICs that each belong to distinct sub-channels of the plurality of the sub-channels.

12. The method of claim 11, wherein the method further comprises, at the channel controller:
using control signals conveyed in control bus lines to select or identify sub-banks from which data is to be read, and wherein a set of PCM ICs of a same sub-bank share a same addressing space, which determines where data chunks are to be read in the set of PCM ICs.

\* \* \* \* \*